(12) United States Patent
Kroell et al.

(10) Patent No.: US 6,537,861 B1
(45) Date of Patent: Mar. 25, 2003

(54) SOI TRANSISTOR WITH BODY CONTACT AND METHOD OF FORMING SAME

(75) Inventors: Karl-Eugen Kroell, Altdorf (DE); Juergen Pille, Stuttgart (DE); Helmut Schettler, Dettenhausen (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/382,108

(22) Filed: Aug. 24, 1999

(30) Foreign Application Priority Data

Aug. 29, 1998 (EP) .............................. 98116406

(51) Int. Cl.[7] .............................................. H01L 21/00
(52) U.S. Cl. ...................... 438/149; 438/299; 357/23.5; 257/301; 257/310; 257/347
(58) Field of Search ................ 438/149, 299; 357/23.5; 257/301, 347, 310

(56) References Cited

U.S. PATENT DOCUMENTS 4,876,582 A * 10/1989 Janning ..................... 357/23.5
5,606,188 A * 2/1997 Bronner et al. .............. 257/301
5,821,146 A * 10/1998 Chang et al. ................ 438/299

FOREIGN PATENT DOCUMENTS

| DE | 196 54 280 A1 | 12/1996 | ........... H01L/29/78 |
| GB | 2 309 825 A | 8/1997 | ........... H01L/29/78 |
| JP | 9-246562 | 9/1997 | ......... H01L/29/786 |
| JP | 9-10-242470 | 9/1998 | ......... H01L/29/786 |

OTHER PUBLICATIONS

"The effect of body contact arrangement on thin SOI MOSFET characteristics", Oh et al., Microelectronic Engineering, vol. 28, No. 1, 1995, pp. 467–470.

* cited by examiner

Primary Examiner—Michael S. Lebentritt
Assistant Examiner—Pho M. Luu
(74) Attorney, Agent, or Firm—Jay H. Anderson

(57) ABSTRACT

An SOI field effect transistor is provided comprising a body contact that is isolated by a shallow trench that is formed into the body portion of the transistor, thereby eliminating any increase in gate capacitance or delay. A method of forming such a transistor is provided that does not require any additional process steps.

7 Claims, 5 Drawing Sheets

SOI TRANSISTOR WITH BODY CONTACT AND METHOD OF FORMING SAME

FIELD OF THE INVENTION

The present invention refers in general to CMOS Silicon-On-Insulator (SOI) technology and, more specifically, to an SOI FET having a body contact. It is also concerned with a method of forming such a transistor.

BACKGROUND ART

Silicon-on-Insulator (SOI) technology is becoming extremely attractive for future high performance low power applications. Partially depleted SOI technology offers a variety of practical advantages such as ease of manufacturing, better control of threshold voltage and tighter control of short channel effects than fully depleted devices.

In the traditional CMOS bulk process (cf. FIGS. 1A to 1C) a transistor is formed by a poly-silicon gate 1 (extending along a gate axis) and the source/drain diffusion region 2 to the left and right of the gate. The region 3 under the gate is the active area of the device, p-type for a n-FET device, n-type for a p-FET.

In the following an n-FET is taken to describe the device characteristics but they are also applicable to a p-FET with inverted polarities and conductivity types.

The region under the gate is also called the body 3 of the device. Source and drain are n-type diffusions and are separated by the p-type body. A positive voltage on the gate converts the p-type silicon thereunder to n-type and forms a thin channel between source and drain, thus a current can flow between source and drain.

Adjacent devices are separated by a trench oxide 4 (STI—silicon trench isolation) to increase density and prevent latch-up effects (parasitic bipolar current).

The performance of a CMOS circuit mainly depends on the maximum current of the device and the total capacitance it has to charge. The current is a complex function of many technology characteristics but as a first approximation the channel length and the threshold voltage $V_t$ are the key parameters. The channel length is defined as the distance between source and drain, the current increases with a smaller channel length. The threshold voltage is the voltage needed on the gate to build the channel. While the channel length is of a physical nature, $V_t$ is a function of many independent physical parameters like gate oxide thickness, doping concentrations and electrical conditions like the body voltage. A positive body voltage lowers the threshold so that the device can switch earlier and the maximum current is increased. The device is faster but also has a higher leakage. To guarantee a reliable function and prevent parasitic bipolar currents between devices through npnp structures (latch-up effect) the body of the device is usually tied to ground through the backside of the silicon wafer or by adjacent body contacts.

Wiring and device capacitance contribute to the total capacitance a device has to drive. The device caps are mainly the gate-to-body cap ($C_g$), the gate-to-source/drain overlap caps ($C_{gs}$, $C_{gd}$) and the source/drain diffusion caps ($C_s$, $C_d$).

In contrast to the bulk technology, the SOI technology employs a layer of silicon overlying an insulating material (usually silicon oxide) on a supporting bulk wafer.

Thus, the active area now is in the top silicon layer (device layer) on top of the buried oxide. The device layer thickness is smaller than the depth of the STI oxide so that the two isolations touch each other. This results in totally isolated devices, there is no longer any connection to the body through the backside of the wafer. The STI acts as a wall surrounding the devices, the buried oxide is the isolating floor.

The body of each device is floating. During current flow through the device impact ionization into the body charges up the body. The voltage level depends on the history of the device, i.e., how often it has switched and the total capacitance it had to drive. The minimum is usually ground for an n-type device, the maximum is limited by the forward diode behavior of the source/drain diffusion and is in the order of a few hundred millivolts. As already mentioned with respect to the bulk technology the threshold voltage and the maximum current of a device are a function of the body voltage. In average the body has a positive potential which lets the device switch earlier because of the lower $V_t$, the current reaches the maximum value faster and the maximum is higher. While a current flows through the device, more charge leaks into the body. Because of impact ionization at the drain diode of the device, the potential increases and, in turn, also the current (kink effect). As a rough estimation all of these effects result in about (10+x) % performance improvement.

Negative effects are the increased leakage currents due to the reduced $V_t$ and a bipolar n-p-n structure (source-body-drain) which can be electrically activated by a positive bias on the base of the parasitic bipolar npn transistor, (i.e., body potential) and results in additional leakage.

Because the body potential now is a function of the device history, the behavior changes over time, there is no longer a fixed delay for a specific circuit, it is only possible to assign a min/max value to each circuit. This, however, causes many problems: analog circuits are hard to control, dynamic logic has to fight with race conditions and increased leakage, the min/max delay characteristics have to be determined, chip integration has to respect a worst case scenario for min/max delay combinations on all the logical units, etc. In some situations where exact timing is important (race conditions in dynamic logic) or symmetrical devices are needed (sense amplifier in cache arrays) a body contact on the transistor gives control over the body potential.

SOI also affects the device capacitance. The source/drain diffusions touch the buried oxide which eliminates the source/drain diffusion capacitance, it nearly goes down to zero. In cases where a circuit has to drive a long wire, the total capacitance is mainly the wiring capacitance (which is the same as that of the bulk process). The diffusion contribution is very small and in total there is nearly no change. But in case of dotted-or situations (like multiplexers or bit lines in arrays) the diffusion has a significant contribution to the total capacitance. As a rule of thumb one can expect an improvement of up to 10% in average due to the elimination of the diffusion capacitance.

In total this results in a 20% performance advantage of SOI over bulk technology.

The body of an SOI device is totally isolated by the buried oxide and the shallow trench isolation. In a normal n-FET device there is no direct access to the body because the source/drain diffusions are n-type while the body is p-type. In order to get access to the body an additional p-type region must be provided which can be contacted from the surface.

Several proposals have been made in the art concerning the provision of SOI transistors including body contacts. In U.S. Pat. No. 5,489,792, Hu et al. propose an SOI MOSFET having improved electrical characteristics, this MOSFET including a low barrier body contact under the source region, and alternatively under the drain region, to facilitate collection and removal of current carriers generated by impact ionization.

Bronner et al., in U.S. Pat. No. 5,606,188, propose an SOI DRAM including a direct body contact between the SOI layer and the silicon substrate, and field-shield isolation positioned on the surface of the SOI structure which extends over the direct body contact.

In U.S. Pat. No. 5,729,039 to Beyer et al., there is disclosed an SOI transistor having a self-aligned body contact formed through an extension to the gate, thereby forming the body contact with minimal increase in area and also avoiding the need to tie the source to the body.

As already mentioned before, dynamic floating body effects have generated considerable problems. Controlling the body voltage has become an issue in situations where a mismatch in threshold voltages between devices (e.g., SRAM sense-amplifiers) or history dependent delays are not acceptable.

An SOI MOS transistor is disclosed in U.S. Pat. No. 5,185,280 to Houston et al., that has an implanted region of the same conductivity type as the body underneath one or both of the extended drain and source portions of the drain and the source with and without a body-to-source (BTS) contact or a general body contact. The floating body effects are said to be minimized by this arrangement. One embodiment is a method of controlling the body voltage by contacting it from the edge of the transistor. The body is elongated at the edge of the transistor and a contact is made to the body. Thus, a polysilicon T-shape acts as the insulation between the p-region and the n-source/drain region.

However, just because of this T-shape, the gate capacitance is increased by about 20% (and more for smaller devices), because it represents an additional area which is parasitic and thus increases the capacitance and leads to a slowdown of the transistor, resulting in a performance reduction of about the same order of 20%.

As an example, Table 1 shows the gate capacitance and delay of a 18/9 µm CMOS inverter (body floating), wherein RF represents the delay rising input to falling output and FR represents the delay falling input to rising output.

TABLE 1

|  | no body contact | with body contact | difference |
| --- | --- | --- | --- |
| gate capac. | 41.7 fF | 49.4 fF | 18.5% |
| delay RF | 38.2 ps | 45.7 ps | 19.6% |
| delay FR | 42.6 ps | 46.6 ps | 9.4% |
| delay total | 80.8 ps | 92.3 ps | 15.4% | fF=femto Farad; ps=pico seconds

OBJECTS OF THE INVENTION

It is therefore an object of the present invention to provide a body contact for an SOI CMOS device without any increase in capacitance and delay.

It is a further object to provide such a body contact that is self-aligning with respect to the width of the device.

It is still another object of the present invention to provide a method of making such a body contact that does not require additional process steps.

Due to the fact that the T-shape has to overlap the diffusion region for process tolerance reasons, a minimum distance from the rail of the T-shape to the adjacent geometries is required (polysilicon to polysilicon and polysilicon to diffusion). Using the present invention eliminates the rail and its overlap and thus results in a higher density. Furthermore, it allows an easy migration of designs in the traditional bulk process to SOI because the device area is not enlarged by the T-shape and the design effort to adjust the layout is minimized.

DETAILED DESCRIPTION OF THE INVENTION

Figure 1A:
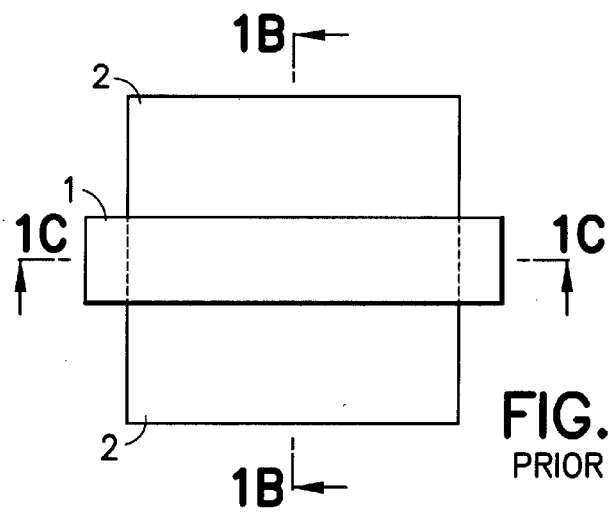
FIG. 1a is a schematic view of a prior art n-FET fabricated in CMOS bulk technology.
Figure 1B:
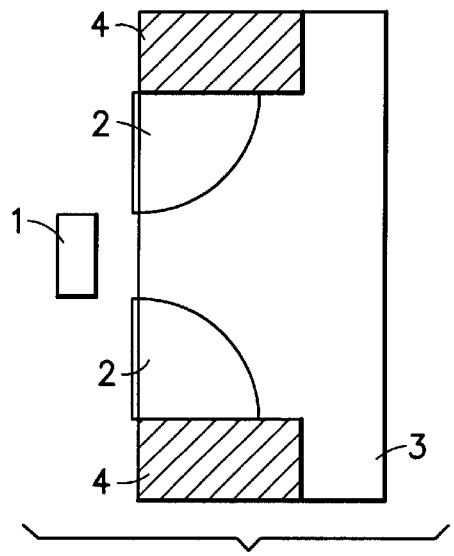
FIG. 1b represents a view along line b—b of FIG. 1A.
Figure 1C:
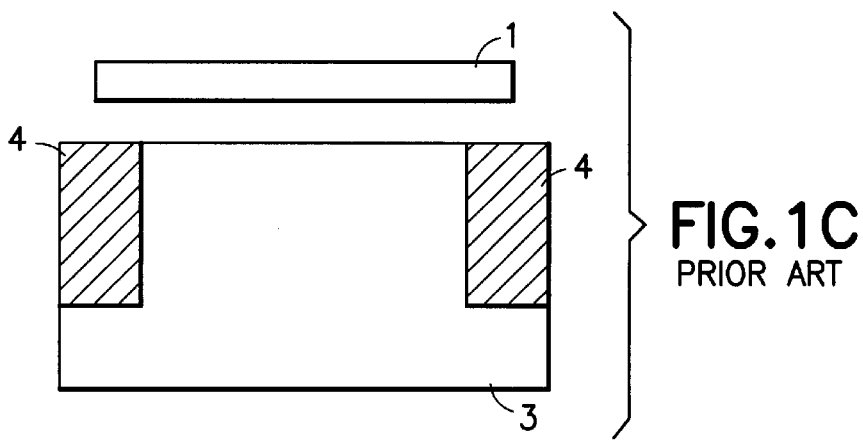
FIG. 1c represents a view along line c—c of FIG. 1A.
Figure 2A:
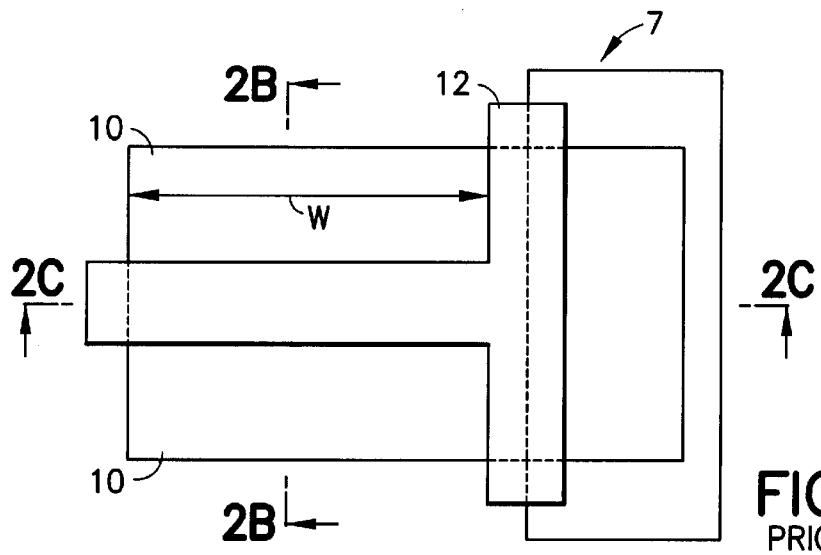
FIG. 2a schematically shows an n-FET fabricated in CMOS SOI technology with a prior art body contact.
Figure 2B:
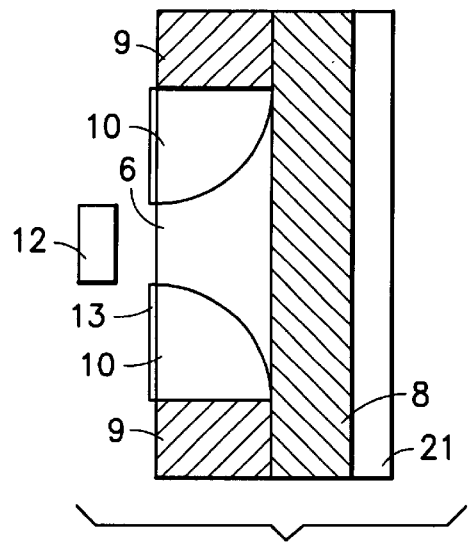
FIG. 2b represents a view along b—b of FIG. 2A.
Figure 2C:
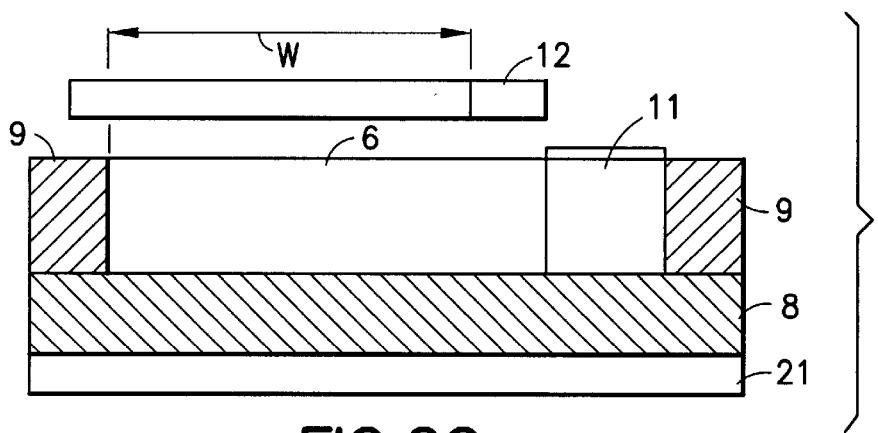
FIG. 2c represents a view along c—c of FIG. 2A.

Referring now to FIG. 2, there is shown an n-FET fabricated in CMOS SOI technology with a body contact according to the state of the art. Whereas in a traditional CMOS bulk technology the body (or body region) of a transistor is connected through the backside of the wafer or by an adjacent body contact, the body 6 of the SOI device 7 is totally isolated by the buried oxide 8 and the shallow trench isolation (STI) 9. In the n-FET device shown there is no direct access to the body 6 because the source/drain diffusions 10 are n-type while the body 6 is p-type. It has to be mentioned that the same holds true for a p-FET device where n- and p-regions are changed. In order to get access to the body, an additional p-type region 11 is provided which can be contacted from the surface to provide the body contact. In order to prevent short circuits, oxide beneath the top of a polysilicon T-shape 12 acts as the isolation between this p-region 11 and the n-source/drain region 10, i.e., as can be seen in FIGS. 2c and 2b, the top of the "T" separates the salicided diffusion surfaces 13 from the salicided surface on the top of body contact member 11. It has to be mentioned that the whole T-shape is made of a single material, preferably polysilicon. Shape 12 serves two functions: the "stem" is the gate and the oxide beneath the top serves to isolate the body contact from the source and/or the drain. The poly on top of the T protects the underlying oxide during the self-aligned gate formation. It is a disadvantage of this arrangement that the fact that the T is a single structure means that there is excess gate capacitance from the top of the T. Block-out mask 7, shown in FIG. 2a, protects body contact member 11 during the S/D implant step. Due to the fact that the T-shape lies in a different plane than the diffusion of the transistor (cf. FIGS. 2B and 2C), it is possible that these two planes may shift with respect to each other, leading to unwanted and unfavorable tolerances in the width of the transistor.

Figure 3A:
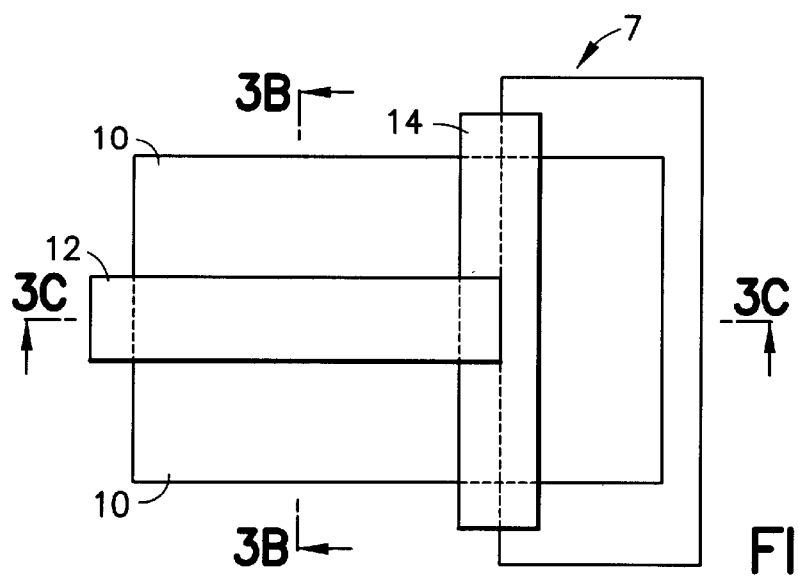
FIG. 3a schematically depicts an n-FET fabricated in CMOS SOI technology according to the invention.
Figure 3B:
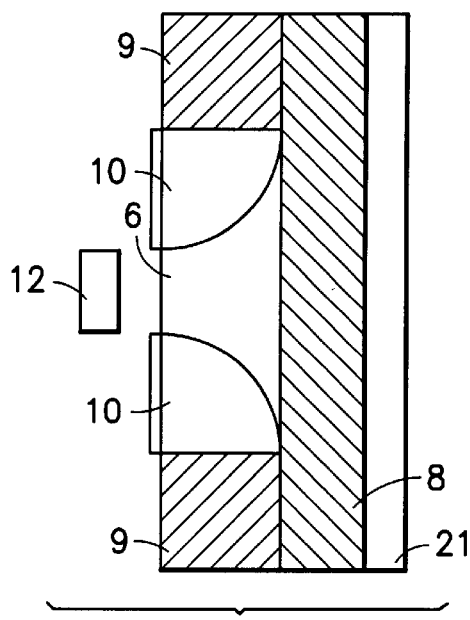
FIG. 3b represents a view along b—b of FIG. 3A.
Figure 3C:
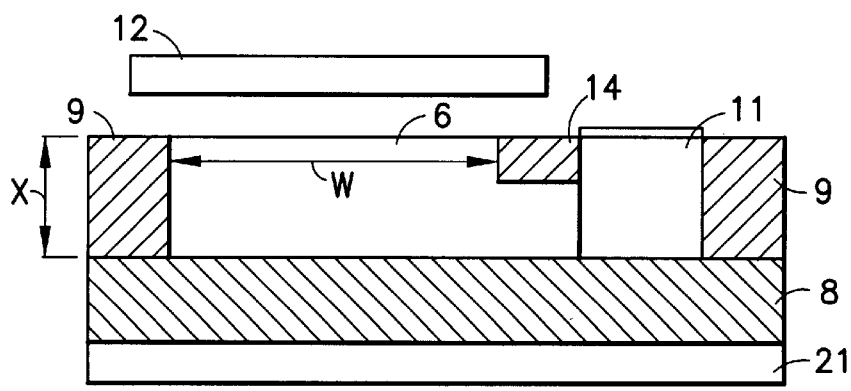
FIG. 3c represents a view along c—c of FIG. 2A.

Looking at FIG. 3, a transistor constructed according to the present invention uses a second shallow trench isolation (body isolation trench) 14 (having a depth such that the buried oxide isn't touched) instead of separating the source/drain regions 10 and the body contact member 11 by a polysilicon T-shape 9. This shallow oxide prevents the generation of the salicide in the open diffusion area thereby isolating the source/drain and body contact regions. It should be noted that the second trench should be as shallow as possible to guarantee a good electrical contact from the surface to the body. The minimum depth is mainly driven by the tolerance and uniformness of the polishing process step after the STI oxide generation. In general, the depth of STI 14 is much less than the active Si thickness ("x" in FIG. 3C).

When looking at FIGS. 2 and 3, it can be seen that, functionally, the top of the "T" in FIG. 2 has been transferred from the polysilicon plane into the oxide trench plane of the transistor. Thus, the mask alignment tolerance between the two planes can no longer contribute to the electrically important channel width tolerance ("w" in FIGS. 2A and 2C as well as in FIGS. 3A and 3C) of the FET.

Since there is no extended gate, there is also no increase in gate capacitance and therefore no delay increase and performance loss. It is essential that trench 14 extends across the entire width of the source or drain to prevent it from shorting to the body contact. In the case that source or drain is connected to the same potential as the body contact the relevant side of the isolation can be eliminated (the T-shape degenerates to a L-shape).

The skilled worker can think of many ways to fabricate the isolation trench. However, special advantages are achieved if the isolation trench 14 is self-aligned as compared to the STI trenches 9 of the FET. One advantageous method how to fabricate such a self-aligned isolation trench is shown in FIGS. 4a to 4f.

The buried oxide 8 is fabricated first on top of substrate 21.

This does not require any photolithographic process step and can be done by ion implantation of oxygen into a blank silicon wafer, followed by proper annealing steps, which need not be described in any great detail. The oxygen is implanted so deep below the surface that the buried oxide 8 forms below the surface. By this processing step the top part of the silicon wafer becomes electrically isolated from the bottom part 21. Silicon 15 will be the active layer for the n-FET and p-FET devices.

Next the silicon surface is covered with an oxide ($SiO_2$) layer 16. Using photolithographic techniques the STI-mask pattern 17 is then applied and etched into layer 16 with the etching being stopped at the interface to layer 15. In this and subsequent processing steps a reactive ion etching technique is assumed which predominantly etches into the depth and not to the sides.

The wafer is then coated with a photoresist blockout layer 18. This layer (after proper patterning) is intended to protect the body isolation regions (14 in FIG. 3C) while the STI trenches (9 in FIG. 4D) are being etched. The pattern to serve this purpose is the blockout mask pattern for the isolation trench, in the following denoted as STIBO (Shallow Trench Isolation Block Out) pattern 19 in FIG. 4A. By photolithography this pattern is transferred to the photoresist layer 18 such that layer 18 gets removed outside the STIBO regions but remains present within these regions.

Now the STI trenches 9 are etched down almost to the buried oxide layer 8 (leaving an oxide thickness comparable to the depth of trench 14) using a technique which attacks silicon but not the oxide and the photoresist which covers the STIBO regions. After that the photoresist 18 is removed without attacking layers underneath.

Now the wafer is ready to etch the isolation trench 14 down to the desired depth 14 at the same time the STI trenches 9 are etched deeper to reach the buried oxide 8. Processing proceeds with removing oxide layer 16 while leaving silicon unattacked.

Figure 4A:
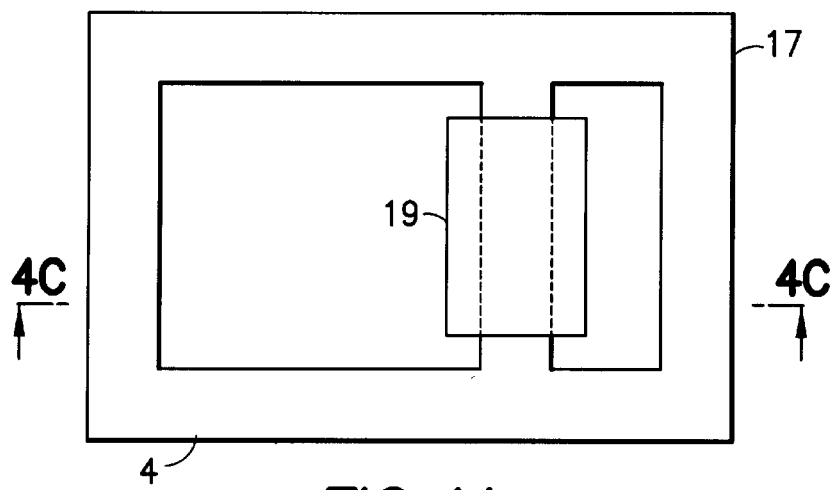
FIGS. 4a–4f schematically depict the method steps of fabricating a self-aligned separation trench according to the invention.
Figure 4B:
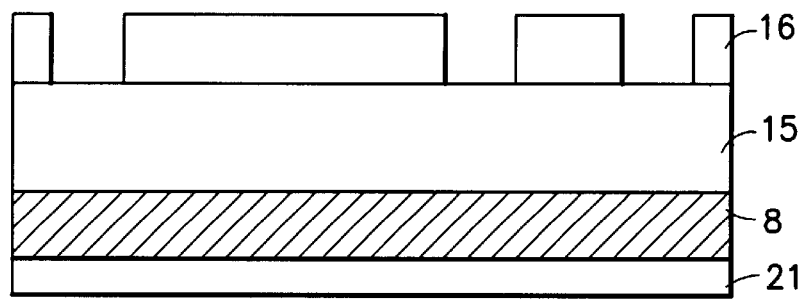
Figure 4C:
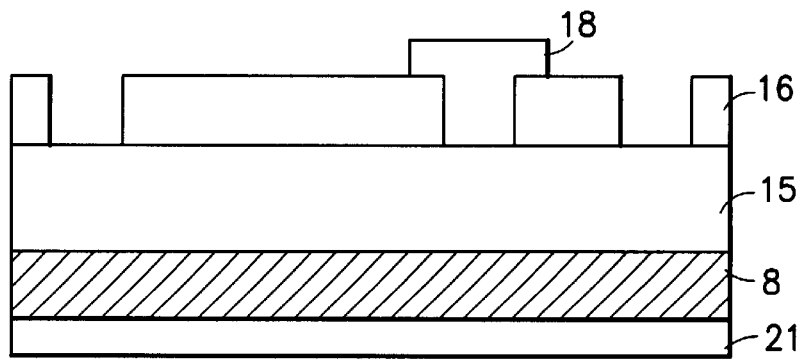
Figure 4D:
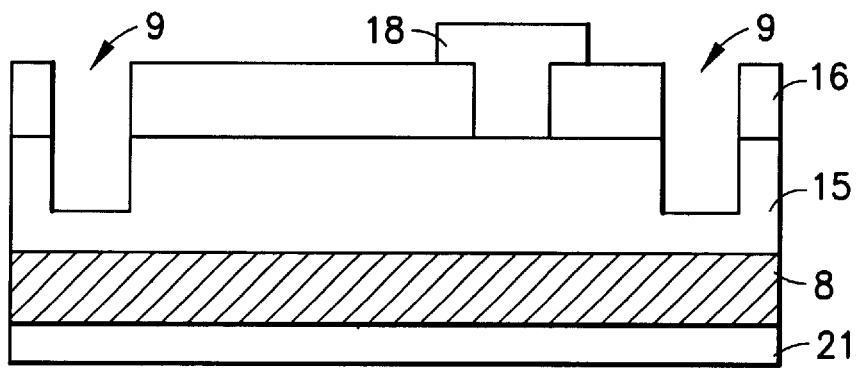
Figure 4E:
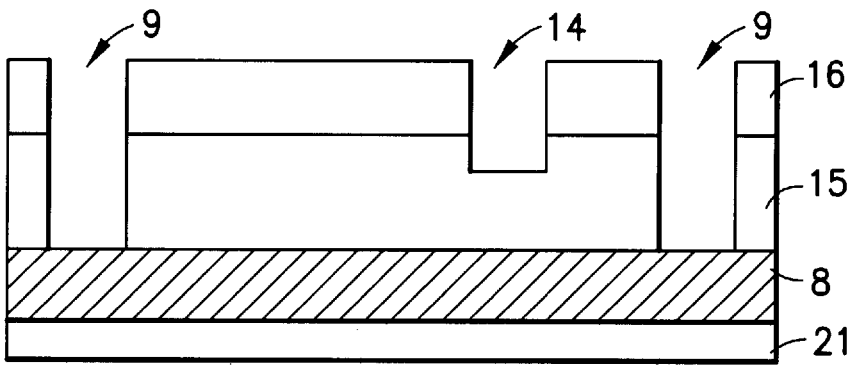
Figure 4F:
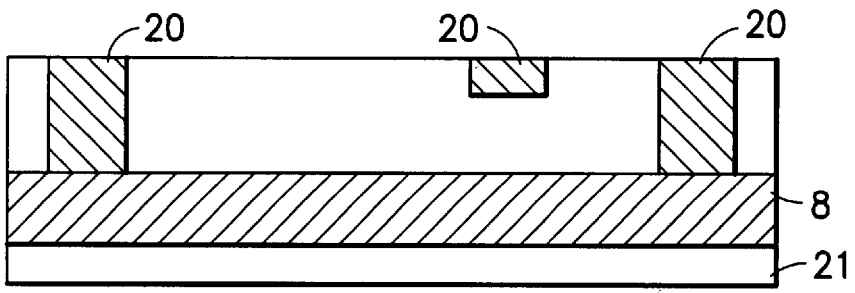

Next the wafer is covered by $SiO_2$ 20 or some other material which fills both the body isolation trench 14 and the STI trenches 9. In a subsequent chemical-mechanical polishing step the $SiO_2$ is removed from the silicon surface but remains in the isolation and STI trenches. This is shown in FIG. 4F.

From now on, standard FET processing can continue to complete the transistor, meaning growing the gate oxide, depositing and patterning the gate, optionally, forming sidewalls on the gate and performing the S/D implant, all referred to as "completing the transistor" for purposes of the claims. It should be noted that the source/drain implantation step will not penetrate trench 14, so that the area below trench 14 will retain its original doping polarity. Thus, the body (below the gate) will have a path through an area of the same polarity under trench 14 to the body contact member 11.

By the technique described above the isolation and STI trenches are selfaligned to each other because they are both defined by the same mask which patterned layer 16.

The layer 16 and 18 materials do not necessarily have to be $SiO_2$ and photoresist. Only the etching and selective etch stopping techniques must be applicable to them as described above.

The new isolation trench feature can thus be implemented by just applying an uncritical block out mask to the photolithographic mask defining the pattern for the shallow trench isolation and performing the STI etch in two steps. No additional process step is necessary.

Thus the present invention is able to provide a body contact for CMOS SOI transistors without increase in gate capacitance and therefore without increase of delay and performance loss.

It has to be noted that the present invention is applicable to a broad variety of SOI, e.g., heteroepitaxy, such as SOS, beam or laser recrystallization, epitaxial lateral overgrowth, lateral solid phase epitaxy, polysilicon, bond and etch back, and single silicon separation. This invention is also applicable to other semiconductor materials on insulator.

While the invention has been described in terms of a single preferred embodiment, those skilled in the art will recognize that the invention can be practiced in various versions within the spirit and scope of the following claims.

We claim:

1. A method for fabricating an SOI field effect transistor having a source and a drain separated by a gate disposed along a gate axis, a body region disposed below said gate and a body contact, in which said body contact is isolated from said gate, said source and said drain by a body isolation trench located in a body isolation trench region of said transistor, characterized by the steps of:

a) preparing an SOI substrate including a device layer, having a device layer thickness, disposed above and in contact with a buried insulating layer having a buried layer thickness;

b) depositing a trench pattern layer on the surface of said device layer;

c) etching a shallow trench isolation pattern covering shallow isolation trenches and said body isolation trench region into said pattern layer, thereby exposing said device layer in said shallow trench isolation pattern;

d) depositing a blocking layer above said body isolation trench region;

e) etching said device layer in said shallow trench isolation pattern down to a first depth less than said device layer thickness by an amount substantially equal to a body isolation depth of said body isolation trench;

f) removing said blocking layer and etching said device layer down to said buried layer in said shallow isolation trenches, whereby, simultaneously with the etching of said shallow isolation trenches, said body isolation region is etched to said body isolation depth less than said device layer thickness, so that a conductive path extends in said device layer along said gate axis from said body region to said body contact;

g) filling the trenches formed in said etching step with an insulating material and planarizing the surface of the resulting structure; and h) completing said transistor.

2. A method according to claim 1, wherein said etching steps are carried out using reactive ion etching.

3. A method according to claim 2, wherein said insulating material is $SiO_2$.

4. A method according to claim 2, wherein said planarizing step is carried out by chemical-mechanical polishing.

5. A method according to claim 1, wherein said insulating material is $SiO_2$.

6. A method according to claim 5, wherein said planarizing step is carried out by chemical-mechanical polishing.

7. A method according to claim 1, wherein said planarizing step is carried out by chemical-mechanical polishing.

* * * * *